(12) United States Patent
Kwon et al.

(10) Patent No.: US 7,184,308 B2
(45) Date of Patent: Feb. 27, 2007

(54) FLASH MEMORY DEVICES AND METHODS FOR PROGRAMMING THE SAME

(75) Inventors: Oh-Suk Kwon, Gyeonggi-do (KR); June Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 69 days.

(21) Appl. No.: 10/965,446

(22) Filed: Oct. 14, 2004

(65) Prior Publication Data
US 2005/0117399 A1 Jun. 2, 2005

(30) Foreign Application Priority Data
Dec. 1, 2003 (KR) ............ 10-2003-0086371

(51) Int. Cl.
*G11C 16/04* (2006.01)
(52) U.S. Cl. ............ 365/185.17; 365/185.18; 365/185.28
(58) Field of Classification Search ........ 365/185.17, 365/185.18, 185.28, 185.04, 194, 195
See application file for complete search history.

(56) References Cited

U.S. PATENT DOCUMENTS

| | | | | |
|---|---|---|---|---|
| 5,677,873 A | 10/1997 | Choi et al. | ............ | 365/185.17 |
| 5,991,202 A | 11/1999 | Derhacobian et al. | . | 365/185.19 |
| 6,049,494 A | 4/2000 | Sakui et al. | ............ | 365/203 |
| 6,134,157 A | 10/2000 | Takeuchi | ............ | 365/200 |
| 6,147,911 A * | 11/2000 | Takeuchi et al. | ........ | 365/185.28 |
| 6,235,583 B1 | 5/2001 | Kawata et al. | ............ | 438/257 |
| 6,353,555 B1 | 3/2002 | Jeong | ............ | 365/185.11 |
| 6,522,583 B2 * | 2/2003 | Kanda et al. | ............ | 365/185.17 |
| 6,975,537 B2 * | 12/2005 | Lutze et al. | ............ | 365/185.18 |
| 2002/0003722 A1 | 1/2002 | Kanda et al. | ............ | 365/185.17 |
| 2002/0191443 A1 | 12/2002 | Lee et al. | ............ | 365/185.18 |

FOREIGN PATENT DOCUMENTS

| | | |
|---|---|---|
| JP | 2-137195 | 5/1995 |
| JP | 11-273367 | 10/1999 |

OTHER PUBLICATIONS

Partial European Search Report for EP application 04027263.5-2210 mailed May 18, 2006.
European Search Report for EP application 04027263.5-2210 mailed Aug. 11, 2006.

* cited by examiner

*Primary Examiner*—Gene N. Auduong
(74) *Attorney, Agent, or Firm*—Myers Bigel Sibley & Sajovec

(57) ABSTRACT

A flash memory device having a memory cell string is programmed. The flash memory device includes a plurality of memory cells. During a programming cycle, application of a program voltage to a channel region of the plurality of memory cells is delaying until after a gate of each of the memory cells of the plurality of memory cells that is to be programmed has reached a programming voltage Vpgm.

35 Claims, 11 Drawing Sheets

FLASH MEMORY DEVICES AND METHODS FOR PROGRAMMING THE SAME

CROSS-REFERENCE TO RELATED APPLICATION

This application is related to and claims priority from Korean Patent Application No. 10-2003-86371, filed Dec. 1, 2003, the disclosure of which is hereby incorporated herein by reference in its entirety.

BACKGROUND OF THE INVENTION

The present invention relates to integrated circuit devices and, more particularly, to flash memory devices and programming methods thereof.

A variety of applications have been developed wherein it is desirable to utilize an integrated circuit (semiconductor) memory device that is electrically erasable and programmable but which does not require a refresh of stored data. Research has further been directed to providing an increased storage capacitance and integrity of data storage in such non-volatile memory devices. One example of non-volatile memory devices that may provide large capacity and high data integrity without refresh of the stored data is a NAND-type flash memory device. Because data is maintained even when power is turned off, such flash memory devices have been widely used in a variety of electronic devices (e.g., hand held terminals, portable computers etc.) where these is a risk of an unexpected power loss (such as from an operator turning off the device).

Non-volatile semiconductor memory devices, such as the NAND flash memory device, may include electrically erasable and programmable memories cells that, under ordinary usage act as read-only memory cells. These devices are sometimes referred to as Flash Electrically Erasable Programmable Read Only Memory cells ("Flash EEPROM cells"). A flash memory cell typically includes a cell transistor. The cell transistor may include a semiconductor substrate (or bulk) of a first-conductivity-type (e.g., P-type) and spaced apart source and drain regions of a second-conductivity-type (e.g., N-type). A floating gate is located between the source and drain regions and stores a charge and a control gate is located on the floating gate. A conventional memory cell array including flash EEPROM cells with such a structure is illustrated in FIG. 1.

As illustrated in FIG. 1, a memory cell array 1 includes a plurality of cell strings (or NAND strings) 10 respectively corresponding to bit lines BL0–BLn. Each of the cell strings 10 includes a string selection transistor SST as a first selection transistor, a ground selection transistor GST as a second selection transistor and a plurality of flash EEPROM cells M0–Mm serially connected between the selection transistors SST and GST. The string selection transistor SST has a drain connected to a corresponding bit line and a gate connected to a string selection line SSL. The ground selection transistor GST has a source connected to a source column selection line CSL and a gate connected to a ground selection line GSL. The flash EEPORM cells M0–Mm are serially connected between a source of the string selection transistor and a drain of the ground selection transistor GSL. The cells M0–Mm are connected to corresponding word lines WL0–WLm, respectively. The word lines WL0–WLm are connected to the string selection line SSL and the ground selection line GSL is connected to a row decoder circuit (X-DEC) 2.

FIG. 2 is a timing diagram schematically illustrating a programming operation for a conventional flash memory device such as that illustrated in FIG. 1. Such a device is described in U.S. Pat. No. 6,353,555 entitled "FLASH MEMORY DEVICE CAPABLE OF MINIMIZING A SUBSTRATE VOLTAGE BOUNCING AND A PROGRAM METHOD THEREOF". As shown in FIG. 2, a program cycle is divided into a bit line setup period, a program period, a recovery (or discharge) period and a verification period. Before the bit line setup period, the bit lines BL0–BLn may be precharged to a power voltage or a ground voltage in the bit line setup section in accordance with program data loaded for example, to a page buffer circuit. In other words, program data such as a "0" for cells to be programmed and a "1" for cells to be program-inhibited may be loaded. For instance, a bit line that is connected to an EEPORM cell transistor to be programmed may be precharged to the ground voltage (VSS). A bit line that is connected to an EEPORM cell transistor inhibited from being programmed may be precharged to the power voltage (VCC). In addition, in the bit line setup period, the string selection line SSL is at the power voltage and the ground selection line GSL and the word lines WL0–WLm are at the ground voltage.

In the program period, a selected word line is set to a program voltage Vpgm (e.g., 15.5V–20V), and non-selected word lines are set up to a pass voltage Vpass (e.g., 10V). For the EEPROM cell transistors connected to bit lines at the ground voltage a bias condition allowing Fowler-Nordheim tunneling (F-N tunneling) is satisfied and electrons are provided to program a floating gate of the EEPROM cell transistor from a bulk electron source/sink where a channel is formed (drain side). In contrast, EEPROM cell transistors connected to bit lines at the power voltage (VCC) are program-inhibited. Before determining whether the EEPROM cell transistor has a required target threshold voltage, voltages on word lines and bit lines may be discharged to the ground voltage as shown during the recovery period (i.e., the discharging period) of FIG. 2.

Examples of program inhibit operations are described in U.S. Pat. No. 5,677,873 entitled "METHOD OF PROGRAMMING FLASH EEPROM INTERGRATED CIRCUIT MEMORY DEVICES TO PREVENT INADVERTENT PROGRAMMING OF NONDESIGNATED NAND MEMORY CELLS THEREIN" and in U.S. Pat. No. 5,991,202 entitled "METHOD FOR REDUCING PROGRAM DISTURB DURING SELF-BOOSTING IN A NAND FALSH MEMORY," the disclosures of which are incorporated herein by reference as if set forth in their entirety.

As described above, a high program voltage Vpgm is applied to the selected word line during the program period of the programming cycle. For the selected word line, a required time for setting a control gate voltage of each flash EEPORM cell to the program voltage typically varies depending on its separation from the row decoder circuit 2. In other words, a first time (in FIG. 2, marked by "A") is shorter than a second time (in FIG. 2, marked by "B"), wherein the first time A is a time needed to set a control gate voltage of a cell close to the row decoder circuit 2 to the program voltage and the second time B is the time needed to set a control gate voltage of a cell far away from the row decoder circuit 2 to the program voltage. This is generally a result of placement of a control gate load of a cell farther away from the row decoder circuit 2 for cells that are farther away from row decoder circuit 2.

Thus, as shown in FIG. 2, in cell(s) far away the row decoder circuit 2, a time that the program voltage is applied relatively short in comparison with cell(s) close to the row decoder circuit 2. In other words, a threshold voltage distribution becomes wider than would otherwise be the case due to a spaced distance from the row decoder circuit 2 for various cells. As a result, an increased programming time is generally provided to ensure programming of flash EEPROM cells far away the row decoder circuit 2 to a target threshold voltage. As a result, a programming time for the memory device increases. Furthermore, as an increased time is provided for programming cell(s) far away the row decoder circuit 2, a threshold voltage of cell(s) close to the row decoder circuit 2 may become higher. If the threshold voltage of a cell is higher than the target threshold voltage, a higher read voltage should generally be applied to a word line of this cell in a read operation. The increase of the read voltage may cause a soft write phenomenon, where electrons are input to a floating gate of a cell transistor by a tunnel effect. As a result, the higher the voltage applied to non-selected word lines in a read operation, the worse a read retention characteristic of the flash EEPORM cell (referred to as data retention characteristic) may become. A difference in threshold voltage, thus, may cause an increase of program time and deterioration of a read retention characteristic of the memory device.

SUMMARY OF THE INVENTION

Embodiments of the present invention include methods for programming a flash memory device having a memory cell string including a plurality of memory cells. During a programming cycle, application of a program voltage to a channel region of the plurality of memory cells is delayed until after a gate of each of the memory cells of the plurality of memory cells that is to be programmed has reached a programming voltage Vpgm.

In some embodiments of the present invention, the string includes a string selection transistor and the program voltage is a ground voltage. The channel region of the plurality of memory cells is charged to a program-inhibit voltage and then the charged channel region of the plurality of memory cells is floated. A voltage is applied to the gates of each of the memory cells to be programmed while the charged channel region is floating. The channel region of the plurality of memory cells is then connected to the program voltage after the gate of each of the memory cells to be programmed has reached the programming voltage Vpgm.

In other embodiments of the present invention, charging the channel region includes connecting a bit line coupled to the string selection transistor to the program-inhibit voltage. The bit line is disconnected from the program-inhibit voltage after charging of the bit line and then the string selection transistor is activated to couple the charged bit line to the channel region. Connecting the channel region of the plurality of memory cells to the program voltage may include connecting the bit line to a latched voltage of a sense amplifier.

In further embodiments of the present invention, applying the programming voltage Vpgm to the gates of each of the memory cells to be programmed while the charged channel region is floating includes applying a pass voltage Vpass to the gates of each of the memory cells and then applying the programming voltage Vpgm to the gates of each of the memory cells to be programmed. A pass voltage Vpass may be applied to gates of the memory cells that are not to be programmed while the charged channel region is floating.

In other embodiments of the present invention, the string includes a string selection transistor and the program voltage is a ground voltage. Delaying application of a program voltage includes deactivating the string selection transistor and applying the program voltage to a bit line connected to the deactivated string selection transistor. The programming voltage Vpgm is applied to the gates of each of the memory cells to be programmed and then the string selection transistor is activated to apply the program voltage to the channel region of the plurality of memory cells. Applying the programming voltage Vpgm to the gates of each of the memory cells to be programmed may include applying a pass voltage Vpass to the gates of each of the memory cells and then applying the programming voltage Vpgm to the gates of each of the memory cells to be programmed. A pass voltage Vpass may be applied to gates of the memory cells that are not to be programmed before activating the string selection transistor.

In further embodiments of the present invention, the string includes a string selection transistor, a gate selection transistor and the plurality of memory cells extending serially between the string selection transistor and the gate selection transistor. Gates of the plurality of memory cells are connected to corresponding word lines and a corresponding bit line is connected to the memory cells through the gate selection transistor.

In other embodiments of the present invention, methods of programming a flash memory device which includes at least one memory cell string including a string selection transistor, a gate selection transistor and a plurality of memory cell transistors extending serially between the string selection transistor and the gate selection transistor and wherein gates of the plurality of memory cell transistors are connected to corresponding word lines and a corresponding bit line is connected to the memory cell transistors through the gate selection transistor are provided. A programming voltage is provided to a selected one of the word lines while a channel region of the string is floated. A program voltage is provided to the channel region of the string after a gate voltage of the memory cell transistor corresponding to the selected one of the word lines reaches the programming voltage. The channel region of the string may be precharged to a program-inhibit voltage before applying the programming voltage. The program voltage may be provided to the channel region of the string while the string selection transistor is activated.

In further embodiments of the present invention, the bit line is set to the program voltage before applying the programming voltage. Providing the program voltage may include activating the string selection transistor after a voltage of the selected one of the word lines reaches the programming voltage. Providing the programming voltage may include providing a pass voltage to the selected one of the word lines and non-selected word line; and providing the programming voltage to the selected one of the word lines. Providing the programming voltage may include simultaneously providing the programming voltage to the selected one of the word lines and a pass voltage to the non-selected word lines.

In other embodiments of the present invention, methods are provided for programming a flash memory device which includes at least one memory cell string including a string selection transistor, a gate selection transistor and a plurality of memory cell transistors extending serially between the string selection transistor and the gate selection transistor and wherein gates of the plurality of memory cell transistors are connected to corresponding word lines and a corresponding bit line is connected to the memory cell transistors through the gate selection transistor. The bit lines are precharged to a precharge voltage. A programming voltage is provided to selected word lines and a pass voltage to non-selected word lines while the string selection transistor is activated. Either a program voltage or a program inhibit voltage is provided to each bit line after gate voltages of the memory cell transistors of the selected word lines reaches the first program voltage. The precharge voltage and the program-inhibit voltage may be a power voltage and the program voltage may be a ground voltage. After a voltage of the selected word lines reaches the programming voltage, the program voltage may be provided to a bit line connected to a memory cell transistor to be programmed. After a voltage of the selected word lines reaches the programming voltage, the program-inhibit voltage may be provided to a bit line connected to a memory cell transistor to be program-inhibited.

In further embodiments of the present invention, methods are provided for programming a flash memory device which includes at least one memory cell string including a string selection transistor, a gate selection transistor and a plurality of memory cell transistors extending serially between the string selection transistor and the gate selection transistor and wherein gates of the plurality of memory cell transistors are connected to corresponding word lines and a corresponding bit line is connected to the memory cell transistors through the gate selection transistor. The bit lines are precharged to a precharge voltage. A string selection transistor of each string is turned on. A pass voltage is provided to the word lines. A programming voltage is provided to selected ones of the word lines. Either a program voltage or a program-inhibit voltage is provided to each of the bit lines after gate voltages of the memory cell transistors of the selected word lines reach the programming voltage.

In other embodiments of the present invention, methods of programming a flash memory device which includes at least one memory cell string including a string selection transistor, a gate selection transistor and a plurality of memory cell transistors extending serially between the string selection transistor and the gate selection transistor and wherein gates of the plurality of memory cell transistors are connected to corresponding word lines and a corresponding bit line is connected to the memory cell transistors through the gate selection transistor are provided. Either a program voltage or a program-inhibit voltage are provided to each of the bit lines responsive to associated data to be programmed. A programming voltage is provided to selected word lines and a pass voltage is provided to non-selected word lines. A string selection transistor of each string is turned on after gate voltages of the memory cell transistors of the selected word lines arrive at the programming voltage.

In further embodiments of the present invention, methods are provided for programming a flash memory device which includes at least one memory cell string including a string selection transistor, a gate selection transistor and a plurality of memory cell transistors extending serially between the string selection transistor and the gate selection transistor and wherein gates of the plurality of memory cell transistors are connected to corresponding word lines and a corresponding bit line is connected to the memory cell transistors through the gate selection transistor. Either a program voltage or a program-inhibit voltage are provided to each of the bit lines responsive to associated data to be programmed. A pass voltage is provided to the word lines. A programming voltage is provided to selected ones of the word lines. A string selection transistor of each string is turned on after gate voltages of the memory cell transistors of the selected word lines reach the programming voltage. After a voltage of the selected word lines reaches the programming voltage, the program voltage may be provided to a bit line connected to a memory cell transistor to be programmed and the program inhibit voltage may be provided to a bit line connected to a memory cell transistor to be program-inhibited.

In yet other embodiments of the present invention, flash memory devices include a memory cell string including a plurality of memory cell transistors. The devices further include a controller configured to, during a programming cycle, delay application of a program voltage to a channel region of the plurality of memory cell transistors until after a gate of each of the memory cell transistors of the plurality of memory cells that is to be programmed has reached a programming voltage Vpgm.

In other embodiments of the present invention, the string further includes a string selection transistor coupling the channel region to a bit line. The flash memory device further includes a sense amplifier latch circuit coupled to the bit line and configured to latch data to be programmed into the memory cell transistors. A program transistor connects the bit line to the program-inhibit voltage and a data transistor connects the bit line to the latched data. The controller is configured to activate the program transistor to precharge the bit line and to active the data transistor to provide the latched data to the bit line. A voltage level detection circuit may be included in the flash memory device coupled to the gates. The voltage level detection circuit may detect a voltage at the gates and generate a detection signal responsive to detection of the programming voltage at the gate of each of the memory cell transistors of the plurality of memory cells that is to be programmed and the controller may be configured to apply the program voltage responsive to the detection signal.

In yet further embodiments of the present invention, flash memory devices include a string having a string selection transistor, a ground selection transistor and memory cell transistors serially connected between the string selection and the ground selection transistors. A bit line is connected to the string, a string selection line is connected to the string selection transistor and word lines are connected to the memory cell transistors. A row selection circuit is configured to select at least one of the word lines and a sense amplification and latch circuit is connected to the bit line. A control circuit is configured to control the sense amplification and latch circuit and the row selection circuit. The control circuit controls the row selection circuit and the sense amplification and latch circuit so that a channel region of the string is set to a program voltage during a program cycle after at least one of the word lines selected by the row selection circuit is driven to a programming voltage by the row selection circuit.

In some embodiments of the flash memory device of the present invention, the control circuit controls the sense amplification and latch circuit so that the bit line becomes precharged to a power voltage before the programming voltage is provided to the at least one selected word line. The control circuit may be configured to active the string selection transistor before the bit line is precharged to the power voltage and the programming voltage is provided to the at least one selected word line. The control circuit may also control the row selection circuit so as to provide the programming voltage to only selected word line after a pass voltage is first provided to the word lines. In other cases, the control circuit may control the row selection circuit so as to simultaneously provide the programming voltage to the at least one selected word line and a pass voltage to other of the word lines.

In yet further embodiments of the present invention, the control circuit controls the sense amplification and latch circuit to set the bit line to the program voltage or a program-inhibit voltage responsive to data to be programmed while maintaining the string selection transistor deactivated until the at least one selected word lines reaches the programming voltage at each of the associated memory cells for selected word lines. The control circuit may control the row selection circuit to activate the string selection circuit after the bit line reaches the program voltage or the program-inhibit voltage responsive to data to be programmed.

In other embodiments of the present invention, flash memory devices include a string having a string selection transistor, a ground selection transistor and memory cell transistors serially connected between the string selection and ground selection transistors. A bit line is connected to the string, a string selection line is connected to the string selection transistor and word lines are connected to the memory cell transistors. The device further includes a row selection circuit configured to select at least one of the word lines, a sense amplification and latch circuit connected to the bit line and a voltage detection circuit connected to the word lines with the memory cells between the voltage detection circuit and the row selection circuit. A control circuit of the device is configured to control the sense amplification and latch circuit and the row selection circuit. The control circuit controls the row selection circuit and the sense amplification and latch circuit so that a channel region of the string is set to a program voltage during a program operation when an output of the voltage detection circuit indicates that a voltage level of the at least one selected word line reaches the programming voltage.

BRIEF DESCRIPTION OF THE DRAWINGS

The present invention will now be described with reference exemplary embodiments illustrated in the attached drawings in which.

DETAILED DESCRIPTION OF THE INVENTION

Figure 1:
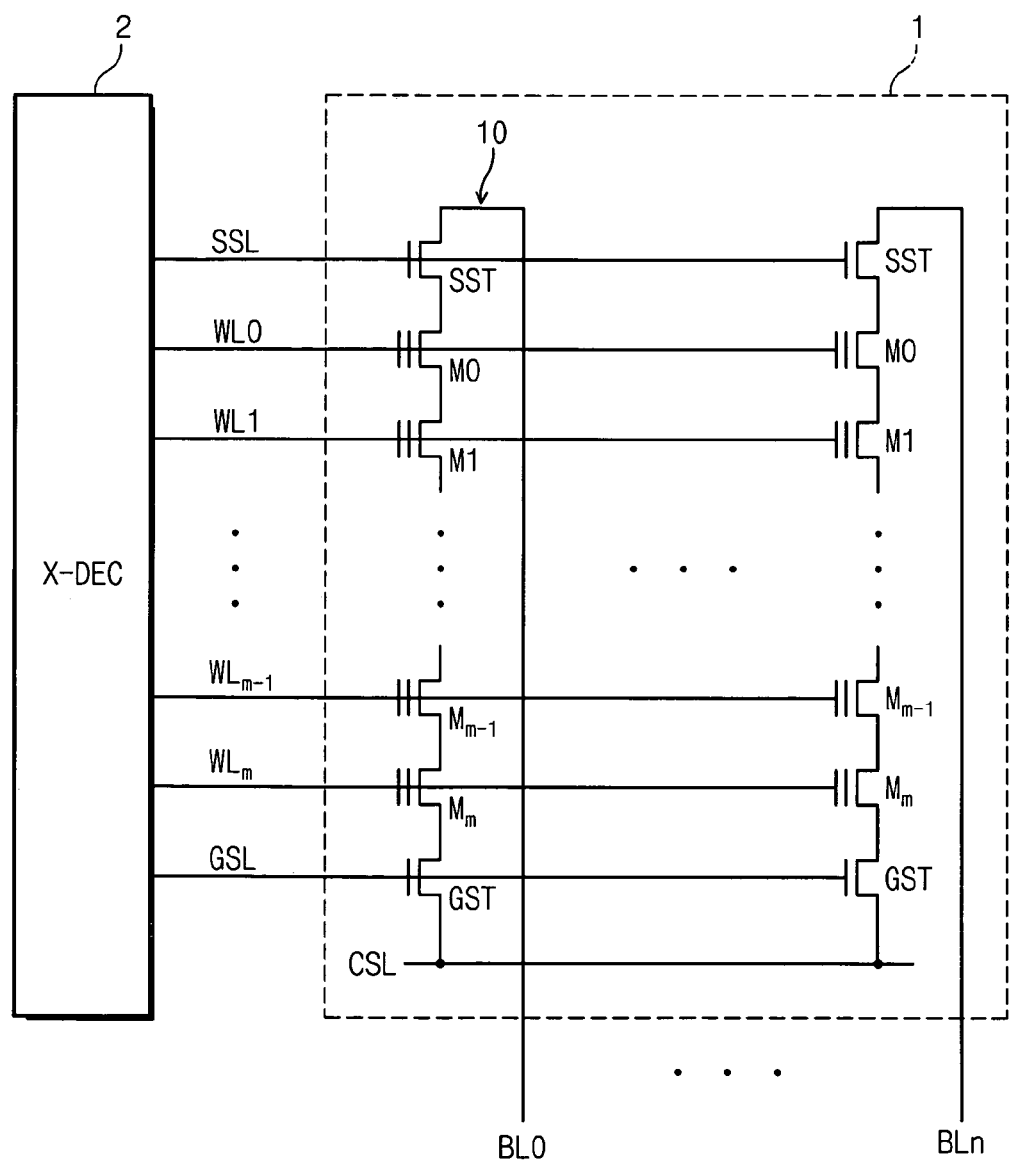
FIG. 1 is a circuit diagram illustrating a memory cell array of a conventional flash memory device.
Figure 2:
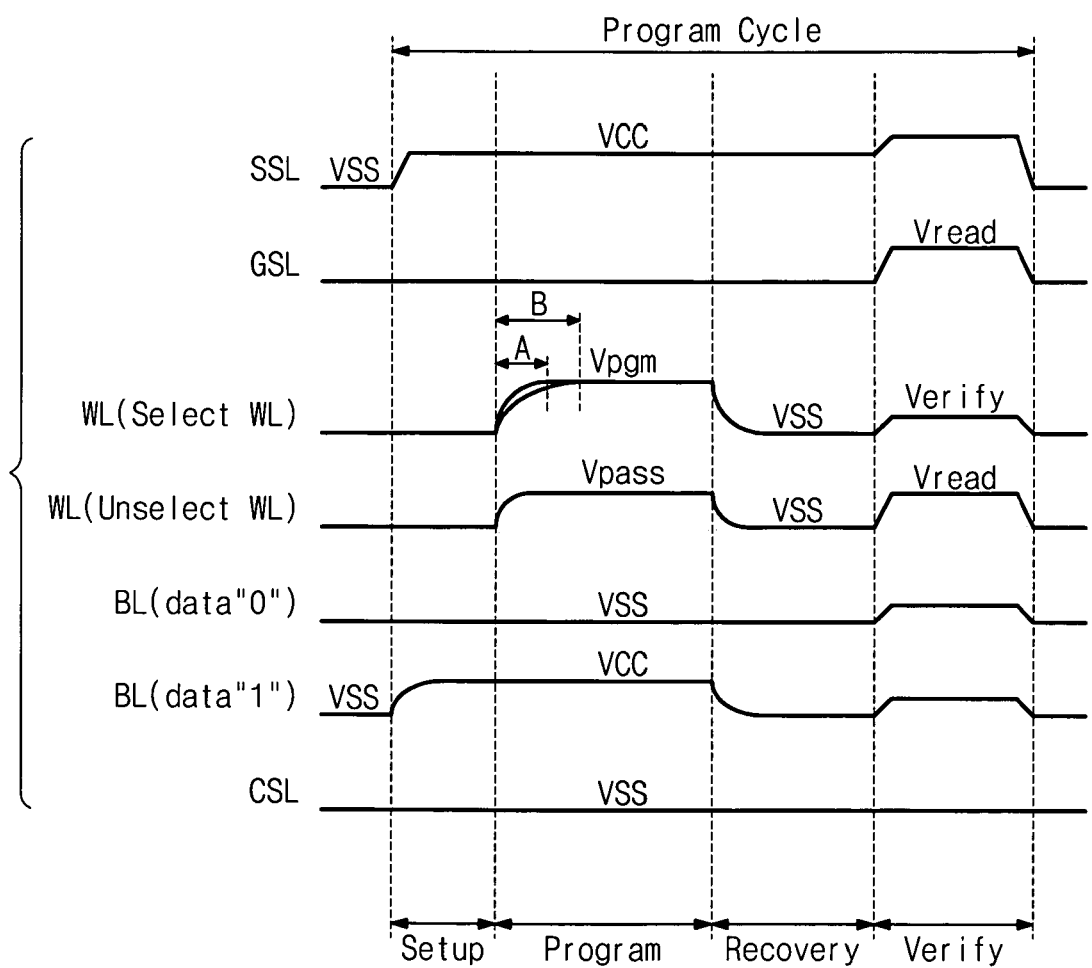
FIG. 2 is a timing diagram schematically illustrating a programming method for a conventional NAND flash memory device.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Various embodiments of the present invention provide flash memory devices and programming methods for such devices. While described herein with reference to a NAND flash device to simplify the description of various embodiments herein, the present invention should not be construed as limited to a NAND flash device. Rather, the described embodiments are merely provided so that this disclosure will be thorough and complete and will fully convey the scope of the invention to those skilled in the art. As is known to those of skill in the art, a flash EEPROM cell, in various configurations, may be programmed by Fowler-Nordheim (F-N) tunneling only when a high voltage, as a programming voltage, is applied to a word line and a ground voltage, as a second program voltage, is applied to a bit line (a channel region of a string including the flash EEPROM cell). In accordance with some embodiments of the present invention, the difference in threshold voltage between flash EEPROM cells caused by the location of cells (e.g., a separation from a row selection circuit) may be reduced by controlling the timing of when F-N tunneling occurs. Various embodiments of the present invention will now be further described.

Figure 3:
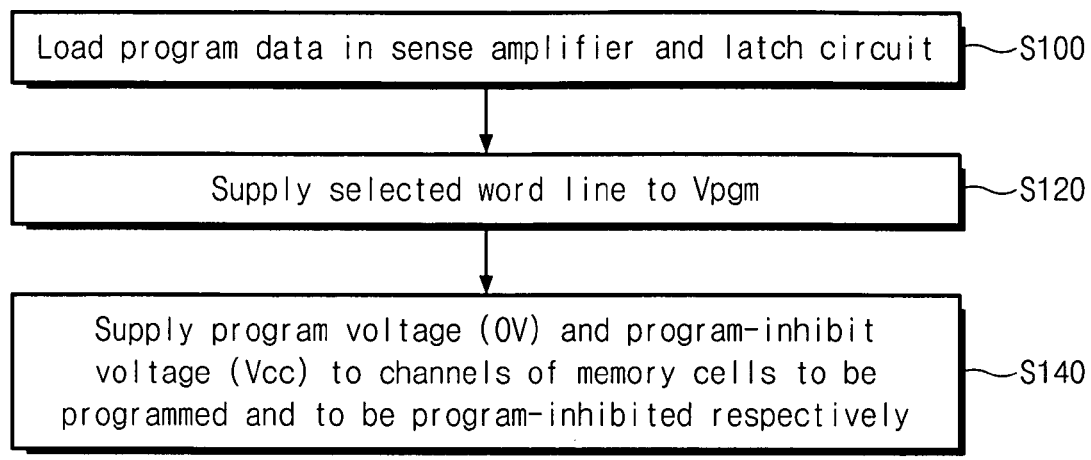
FIG. 3 is a flowchart schematically illustrating programming of a flash memory device according to some embodiments of the present invention.

Referring first to the embodiments of FIG. 3, to program a NAND flash memory device, data to be programmed is loaded in a sense amplification and latch circuit, which maybe referred to as a page buffer circuit (Block S100). A program voltage Vpgm is provided to a selected word line (Block S120). After the program voltage is provided to the selected word line and a predetermined time passes, a ground voltage (referred to as voltage (0V) in FIG. 3) is provided to a channel region of a cell string or a NAND string including a cell to be programmed (Block S140). In the case of a cell to be programmed, the predetermined time may be equivalent to a time required to set all control gate voltages of the flash EEPROM cells of the selected word line to the program voltage Vpgm. The flash EEPROM cell connected to the selected word line is programmed when a ground voltage is provided to a channel region of a cell string (i.e., the bit line in the cell region). As also indicated at Block S140, when a ground voltage is provided to the NAND string including a cell to be programmed or the channel region of the cell string, a power voltage (Vcc) operating as a program-inhibit voltage is provided to a NAND string including a cell to be program-inhibited or the channel region of the cell string (i.e., the bit line in the cell region).

For the described embodiments of methods of programming a flash memory device of FIG. 3, a ground voltage may be variously provided to a channel region of a cell string, such as based on the location of the channel region of the cell string. For example, before a programming voltage Vpgm is applied to a selected word line, the channel region of the cell string may be precharged to a power voltage (Vcc) as a program-inhibit voltage. After the programming voltage Vpgm is applied to the selected word line and with the string selection transistor in an on (active) state, the ground voltage may be provided to the channel region of the cell string (i.e., the bit line). In addition, before the programming voltage Vpgm is applied to the selected word line and with the string selection transistor in an off (deactivated) state, the bit line into the string selection transistor may be set to the ground voltage. After a voltage of the selected word line reaches the programming voltage Vpgm, the string selection transistor may be turned on. As a result, the ground voltage may be provided to the channel region of the cell string.

In other words, for various embodiments of the present invention, after a selected word line is set to the program voltage Vpgm, regardless of its separation from the row selection circuit (i.e., after control gate voltages of the flash EEPROM cells of the selected word line arrive at the program voltage), the ground voltage is provided to the channel region of the cell string to be programmed. As a result, a difference in threshold voltage among cells of same word line caused by their separation from the row selection circuit may be reduced. A decreased programming time and reduced deterioration in a read maintenance characteristic of the memory device may, thus, be provided.

Figure 4:
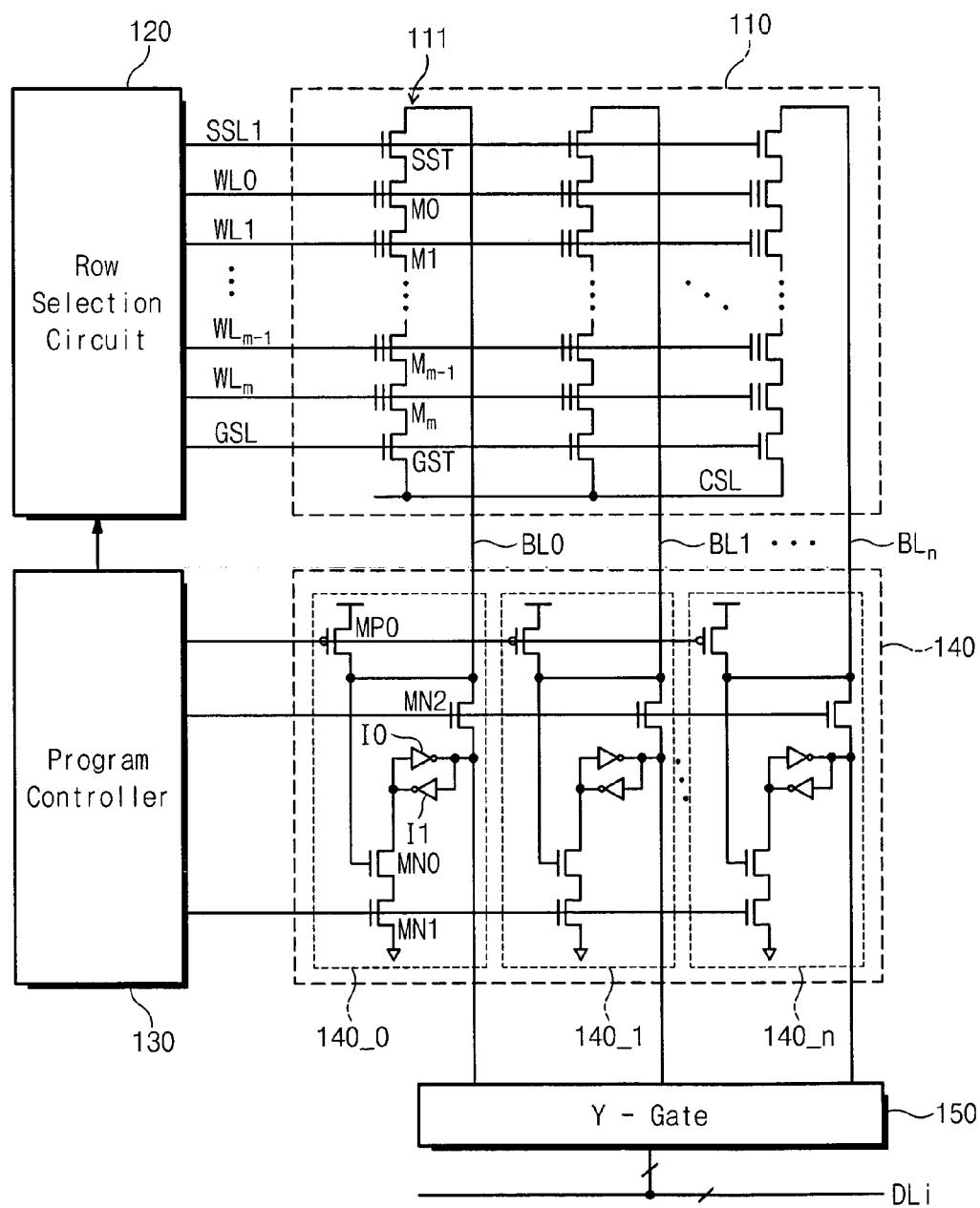
FIG. 4 is a schematic diagram illustrating a flash memory device according to some embodiments of the present invention.

FIG. 4 is a block diagram illustrating a flash memory device according to some embodiments of the present invention. As shown in FIG. 4, the flash memory device 100 includes a memory cell array 110. The memory cell array 110 for the illustrated embodiments includes a plurality of cell strings 111, respectively corresponding to bit lines BL0–BLn. Each of the cell strings 111 is shown as including a string selection transistor SST as a first selection transistor, a ground selection transistor GST as a second selection transistor and a plurality of flash EEPROM cells M0–Mm serially connected between selection transistors SST and GST. Each string selection transistor SST has a drain connected to a corresponding bit line and a gate connected to a string selection line SSL. The ground selection transistors GST have a source connected to a common source line CSL and a gate connected to a ground selection line GSL. The flash EEPROM cells M0–Mm are illustrated as serially connected between a source of the string selection transistor SSL and a drain of the ground selection transistor GST. The cells M0–Mm are shown connected to word lines WL0–WLm, respectively.

The word lines WL0–WLm, the string selection line SSL and the ground selection line GSL in the illustrated embodiments are connected to a row selection circuit 120. The row selection circuit 120 may select one of the word lines WL0–WLm in a program operation and apply a programming voltage Vpgm selected word lines and a pass voltage Vpass to non-selected word lines. The row selection circuit 120 may activate the string selection line SSL (set the line to a power voltage) in the program operation. In such an instance, a supply point/time of the program voltage to the selected word line and an activation point/time of the string selection line SSL can be varied responsive to a control input from a program controller 130 (a program scheduler). A description of embodiments of such operations will be further described with reference to FIG. 5.

Referring again to the embodiments of FIG. 4, the flash memory device 100 includes a sense amplification and latch circuit 140 controlled responsive to the program controller 130. The sense amplification and latch circuit 140 in the illustrated embodiments includes a plurality of sense amplification and latch units 140_0–140_n, which correspond to the bit lines BL0–BLn, respectively. Each of the sense amplification and latch units 140_0–140_n latches data that is transferred through a column gate (Y-Gate) circuit 150 in a program operation. In addition, the sense amplification units 140_0–140_n may provide a ground voltage as a program voltage (for cells to be programmed) and a power voltage as a program-inhibit voltage (for cells not to be programmed) to a corresponding bit line based on associated latched data. For the illustrated embodiments of FIG. 4, each of the sense amplification and latch units 140_0–140_n includes a PMOS transistor MP0, NMOS transistors MN0, MN1 and MN2 and a latch defined by inverters 10 and 11. The coupling between ones of the sense amplification units 140_0–140_n is also shown in FIG. 4. It is to be understood by those skilled in the art that the present invention is not limited to use of the sense amplification and latch circuit 140 shown in the embodiments of FIG. 4.

Figure 5:
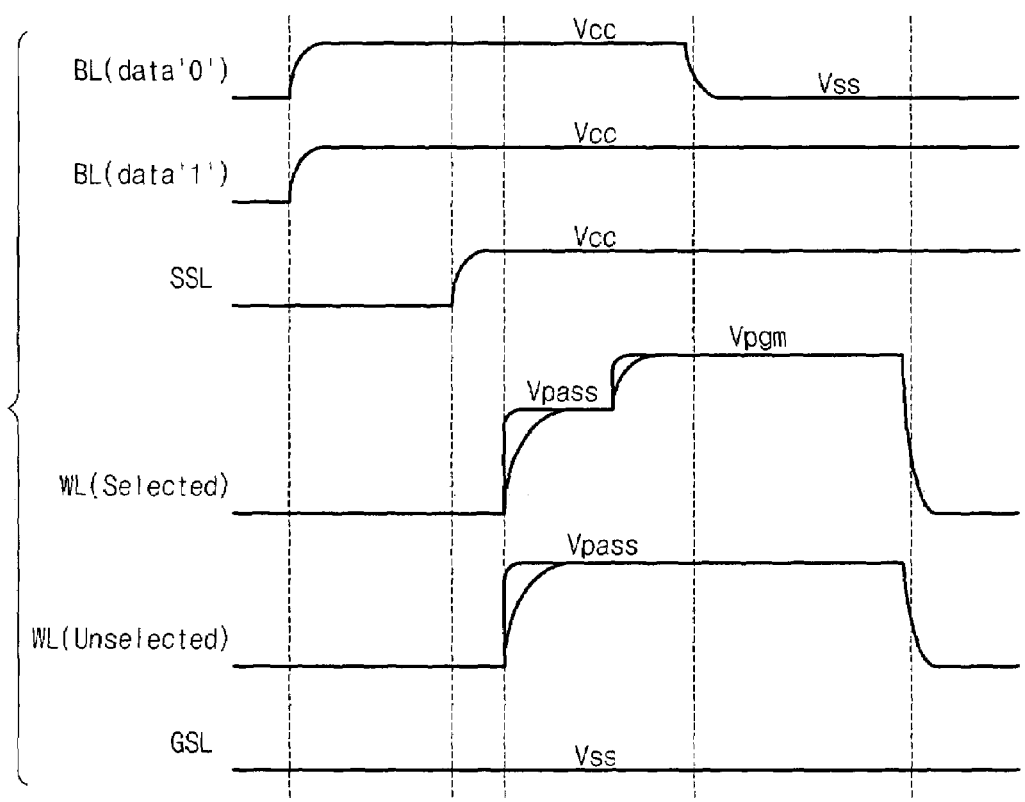
FIG. 5 is a timing diagram illustrating operations of the flash memory device of FIG. 4 according to some embodiments of the present invention.

FIG. 5 is a timing diagram illustrating operations of the flash memory device of FIG. 4 according to some embodiments of the present invention, in particular, programming operations. As is well known, flash EEPROM cells are typically erased to have a −1V threshold voltage before programming of the flash EEPROM cells. Data that will be stored in the memory cell array 110 may then be loaded through the column gate circuit 150 into the sense amplification and latch circuit 140 by word/byte unit. After data to be programmed is loaded in the sense amplification and latch circuit 140, the word lines WL0–WLm and the bit lines BL0–BLn may be set up responsive to control signals from the program controller 130.

In particular embodiments of the present invention, the program controller 130 controls the sense amplification and latch circuit 140 so as to precharge the bit lines BL0–BLn to the power voltage. This may be performed by turning on the PMOS transistor MP0 of each sense amplification and latch units 140_0–140_n during a predetermined time. In such embodiments, while the bit lines BL0–BLn are precharged to the power voltage, the string selection line SSL, the word lines WL0–WLn and the ground selection line GSL are maintained at a low level. As the string selection line SSL and the ground selection line GSL are at a low level, each cell string is electrically separated from a corresponding bit line. After the bit lines BL0–BLn are precharged to the power voltage, the program controller 130 may turn off the PMOS transistor MP0 of each of the sense amplification and latch units 140_0–140_n. Even if the PMOS transistor MP0 of each of the sense amplification and latch units 140_0–140_n is turned off, as shown in FIG. 5, each of the bit lines may maintain the power voltage.

Next, as shown in the embodiments of FIG. 5, as the power voltage (Vcc) is provided to the string selection line SSL, a voltage Vcc-Vth (Vth representing a threshold voltage of the string selection transistor SST) is applied to precharge a channel region of each string. While not shown in FIG. 5, in some embodiments, the string selection transistor SST of the cell strings 111 is shut off at this time so that channel regions of the cell strings 111 float. However, the channel region may be floated without turning of the string selection transistor SST by turning off the transistors MP0 and MN2 (FIG. 4). A pass voltage Vpass may be provided to both the selected and non-selected word lines WL0–WLm at the same time. Then, as shown in the embodiments of FIG. 5, a voltage of the selected word line may be increased from the pass voltage Vpass to the programming voltage Vpgm. It will be understood that the voltage applied to the selected word lines at the row selection circuit 120 may be somewhat greater than the programming voltage Vpgm at the gates of the selected transistors of the memory cells and that, as discussed herein, timing of application of the program voltage and the programming voltage refers to the reaching by the gates of a programming voltage Vpgm high enough to cause programming if the channel region is at the program voltage level.

Continuing with the description, when the programming voltage Vpgm is applied, channel regions of the cell strings 111 are boosted because channel regions of the cell strings 111 are in a floating state. As such, the flash EEPROM cells of the selected word line are not programmed. In particular, for such embodiments, a bias condition is not enough to cause Fowler-Nordheim tunneling between a control gate of the flash EEPORM cell and a channel region. As shown in FIG. 5, the time for the control gate voltage of the flash EEPROM cells of the selected word line to rise to the programming voltage may depend on a separation from the row selection circuit 120, in other words, due to a gate loading difference.

Under the bias condition mentioned above, after the programming voltage Vpgm is applied to the selected word line, and a predetermined time passes, the program controller 130 controls the sense amplification and latch circuit 140 to provide a ground voltage as a program voltage and a power voltage as a program-inhibit voltage to each bit line depending on the corresponding loaded data to be programmed into the memory cells of the string. This may be performed by turning on a NMOS transistor MN2 of each of the sense amplification and latch units 140_0–140_n. For example, when data to be programmed is at a logic level "0," a voltage of a bit line becomes a ground voltage. In contrast, when data to be programmed is at a logic level "1," the voltage of the bit line attains a precharged state, in particular, a power voltage level (as a program-inhibit voltage). When the string selection transistor SST connected to a bit line at the ground voltage is turned-on, for those embodiments, not illustrated in FIG. 5, where it is turned-off as described above, a boosted voltage of the channel region of the cell string becomes discharged through the bit line to a corresponding sense amplification and latch unit 140-0–140_n. Otherwise, the discharging may occur responsive to activation of the NMOS transistor MN2. In other words, the ground voltage is provided to the channel region of the cell string. As the ground voltage is provided to the channel region of the cell string, the flash EEPROM cell(s) of a selected word line are programmed through F-N tunneling.

As discussed earlier, in a manner similar to known programming operations, the flash EEPROM cells of a selected word line may have a different gate loading depending on its location. In conventional devices, the gate loading is typically changed based on a position of a cell, which may increase a program time and deteriorate a read-retention characteristic of the memory device. However, according to some embodiments of the present invention, after control gate voltages of all the flash EEPROM cells of the selected word line reach the program voltage Vpgm, irrespective of their separation from the row selection circuit 120, the ground voltage is provided to the channel region of the cell string (the bit line in a turn-on state of the string selection transistor). As a result, all flash EEPROM cells of the selected word line may be provided the same F-N tunneling time. Accordingly, each of the flash EEPROM cells ideally has substantially the same threshold voltage, subject to process characteristic variations therebetween. In other words, in comparison with a conventional programming method, it may be possible to lessen a difference of a threshold voltage among the flash EEPORM cells of the same word line, which difference may be caused by the separation distance between the cells and the row selection circuit 120. As a result, a decrease in programming time and a reduction in deterioration of a read-retention characteristic may be provided.

Figure 6:
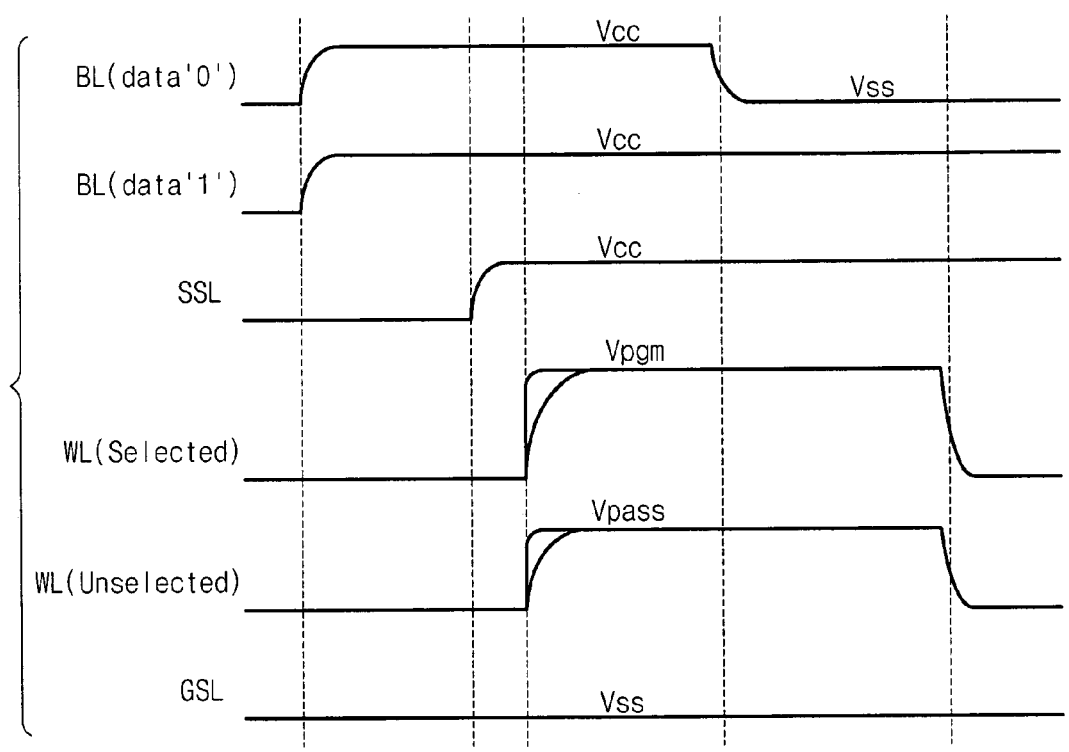
FIGS. 6 to 8 are timing diagrams illustrating operations of the flash memory device of FIG. 4 according to other embodiments of the present invention.

As shown in the embodiments of FIG. 5, the pass voltage Vpass and the programming voltage Vpgm are sequentially provided to the selected word line. However, as shown in the embodiments of the present invention illustrated in FIG. 6, the programming voltage Vpgm may be applied to the selected word line and the pass voltage Vpass may be simultaneously applied to non-selected word line. The programming methods illustrated by the timing diagram of FIG. 6 are performed in substantially the same way as described with reference to the embodiments of FIG. 5 except for aspects related to providing the program voltage to the selected word line noted above and, accordingly, such common aspects will not be further described herein.

Figure 7:
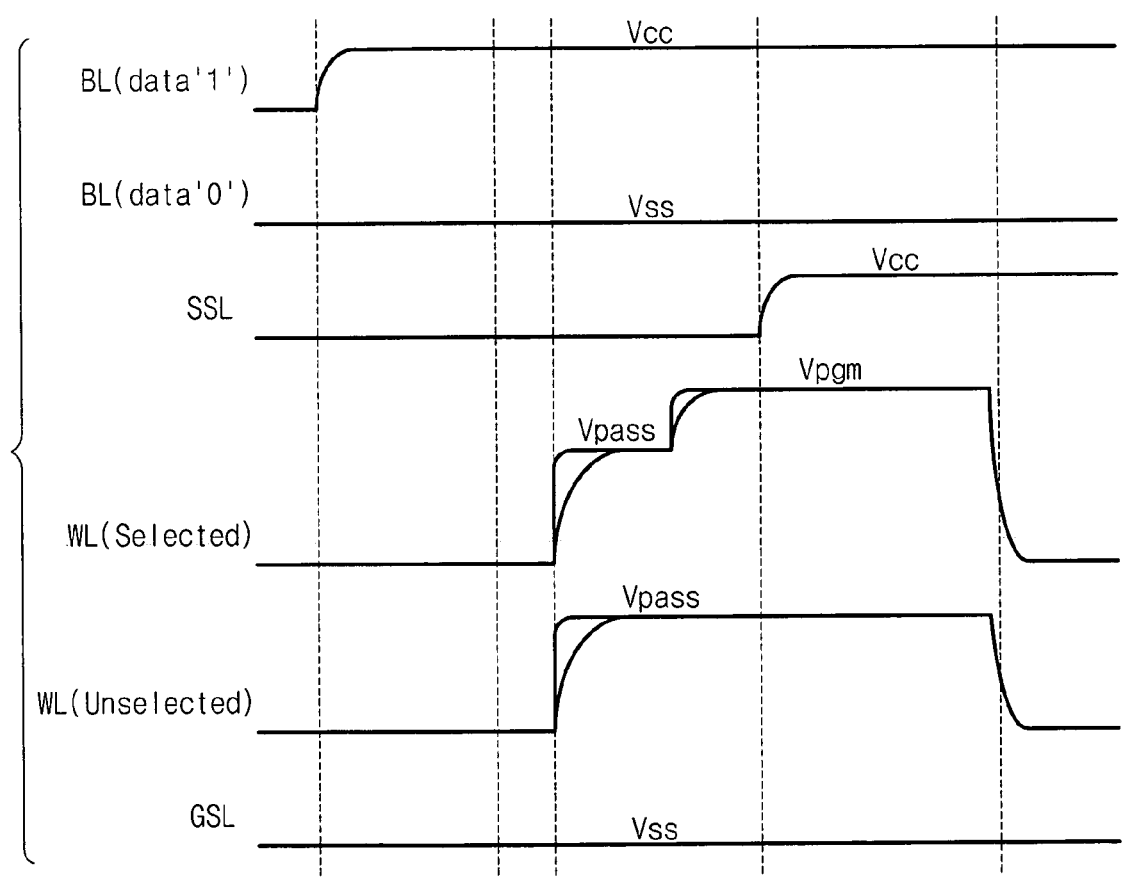

FIG. 7 is a timing diagram illustrating a programming operation of the flash memory device of FIG. 4 according to some embodiments of the present invention. As previously noted, the flash EEPROM cells may be erased to have a −1V threshold voltage before programming. Data that will be stored in the memory cell array 110 may be loaded through the column gate circuit 150 to the sense amplification and latch circuit 140 by word/byte unit. After data to be programmed is loaded to the sense amplification and latch circuit 140, voltages of the word lines WL0–WLm and the bit lines BL0–BLn may be set up under the control of the program controller 130.

As shown in the embodiments of FIG. 7, the program controller 130 controls the sense amplification and latch circuit 140 so that each of the bit lines BL0–BLn is set up to the power voltage or the ground voltage according to loaded data with the string selection transistors SST in an off (deactivated) state. This may be performed by turning on the NMOS transistor MN2 of each of the sense amplification and latch units. While the bit lines BL0–BLn are set to the power voltage or the ground voltage, respectively, the string selection line SSL, the word lines WL0–WLm and the ground selection line GSL are maintained at a low level (ground voltage). Because the string selection line SSL is at the ground voltage, each of the cell strings is electrically separated from its corresponding bit line.

Next, as shown in FIG. 7, the program controller 130 controls the row selection circuit 120 so that the pass voltage Vpass is simultaneously provided to the selected and non-selected word lines WL0–WLm. After the pass voltage Vpass is provided to the selected and non-selected word lines WL0–WLm at the same time, a voltage of the selected word line is increased from the pass voltage Vpass to the programming voltage Vpgm. At this time, as the channel regions of the cell strings 111 are in a floating state, they are boosted. Accordingly, the flash EEPROM cells of the selected word line are not programmed because a bias condition thereon is not high enough to cause F-N tunneling between the control gate of the flash EEPROM cell and the channel region. As shown in FIG. 7, the variation in timing of the control gate voltages of the flash EEPROM cells of the selected word line reaching the programming voltage Vpgm may depend on a difference in separation of the cells from the row selection circuit 120. As previously mentioned, this difference may be caused by a gate loading difference.

Under the bias state described above, after the programming voltage Vpgm is applied to the selected word line, and a predetermined time is passed, as shown in the embodiments of FIG. 7, the power voltage is applied to the string selection line SSL. This turns on the string selection transistors SST. As a result, the bit lines are electrically connected to the channel regions of the cell strings. While not shown in FIG. 7, a string selection transistor connected to a bit line set at the power voltage may be shut off after charging of the cell string. In contrast, a string selection transistor connected to a ground voltage bit line may remain turned on so that a channel voltage of the string is discharged to the ground voltage. In other words, the ground voltage is provided to the channel region of the cell string so that the flash EEPROM cell(s) of the selected word line may become (s) programmed by F-N tunneling.

For the embodiments illustrated in FIG. 7, after control gate voltages of all flash EEPROM cells of the selected word line reach the programming voltage, irrespective of their separation from the row selection circuit, the ground voltage is provided to the channel region of the cell string as also shown in FIG. 5. Therefore, in comparison with a conventional programming method, it may be possible to lessen a difference in threshold voltage among the flash EEPORM cells of the same word line, which may otherwise result from the separation of respective cells from the row selection circuit 120. As a result, a decreased programming time and a reduced deterioration of a read-retention characteristic may be provided.

Figure 8:
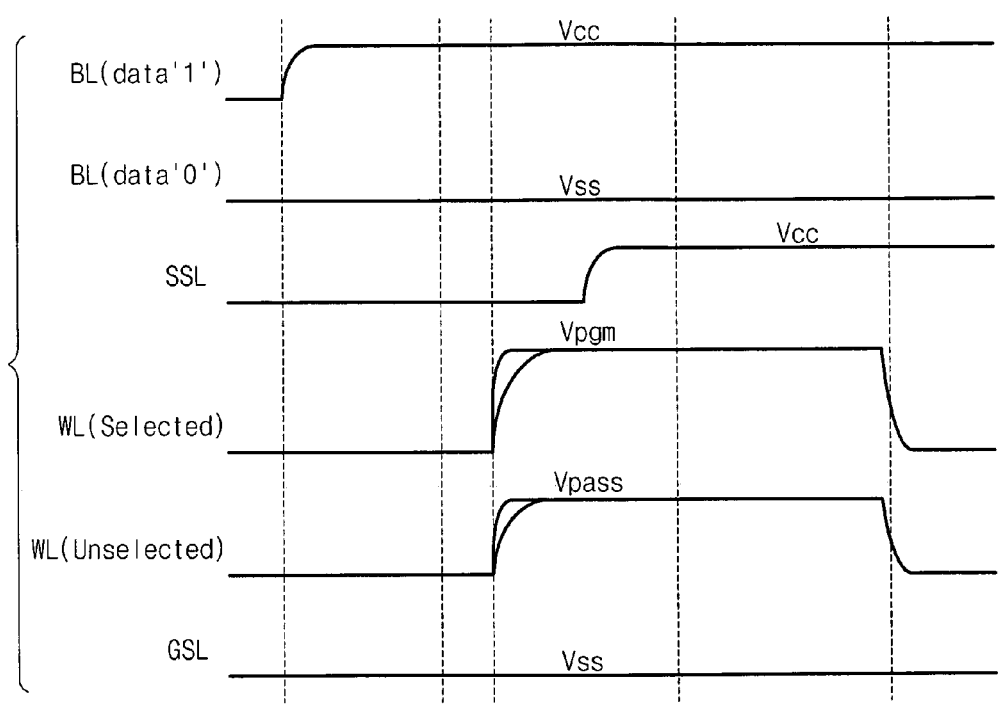

In the embodiments of FIG. 7, the pass voltage Vpass and the programming voltage Vpgm are sequentially provided to the selected word line. However, as shown in the embodiments of FIG. 8, the programming voltage Vpgm may be applied to the selected word lines and the pass voltage Vpass may be applied to the non-selected word lines. The embodiments of FIG. 8 operate substantially as described with reference to FIG. 7 except for the provision of the programming voltage to the selected word line. Therefore, other aspects of the embodiments of FIG. 8 need not be further described herein.

Figure 9:
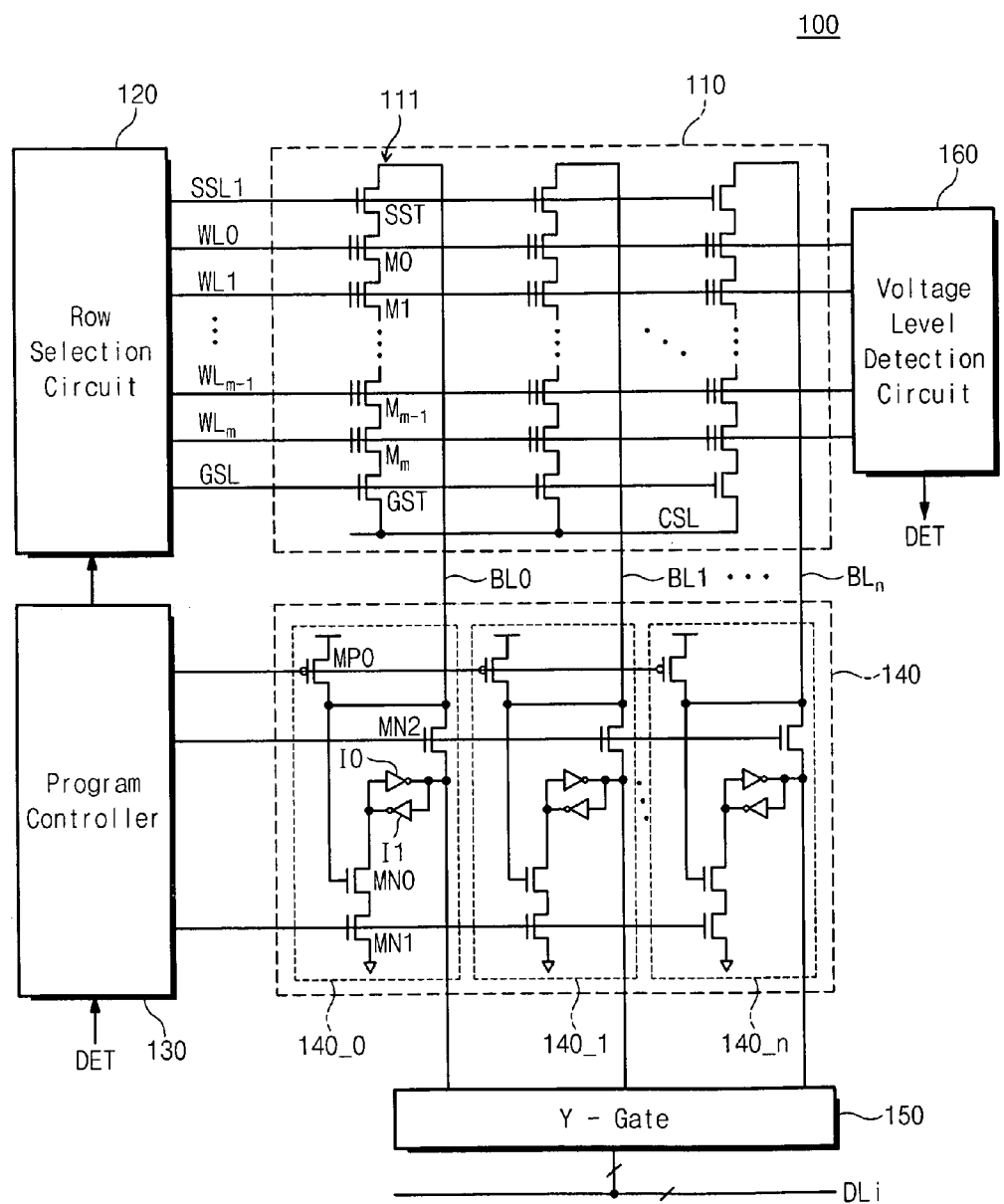
FIG. 9 is a schematic diagram illustrating a flash memory device according to further embodiments of the present invention.

FIG. 9 is a schematic diagram illustrating a flash memory device according to further embodiments of the present invention. The embodiments of FIG. 9 substantially correspond to the embodiments of FIG. 4 except for the addition of a voltage level detection circuit 160. The voltage level detection circuit 160 is shown located opposite the row selection circuit 120 and connected to the word lines WL0–WLm. The voltage level detection circuit 160 detects whether a voltage of the selected word line has reached the programming voltage Vpgm. If a voltage of the selected word line reaches the programming voltage Vpgm, the voltage level detection circuit 160 may activate a detection signal DET. The program controller 130 may control the sense amplification and latch circuit 140 and/or the row selection circuit 120 to provide the ground voltage to the channel region of the string responsive to activation of the detection signal DET. For example, where a programming method such as illustrated in FIG. 6 is used with the device of FIG. 9, the program controller 130 may control the sense amplification and latch circuit 140 responsive to the activation of the detection signal DET. As a result, the NMOS transistor MN2 of each of the sense amplification and latch units may be turned on. Where a programming method such as illustrated in FIG. 7 is used with the device of FIG. 9, the program controller 130 may control the row selection circuit 120 responsive to activation of the detection signal DET. As a result, the string selection transistors SST may be turned on. Except of these aspects, the flash memory device of the embodiments of FIG. 9 operates substantially as was described above with reference to FIGS. 5 to 8 and, accordingly, further description of these aspects need not be provided herein.

Figure 10:
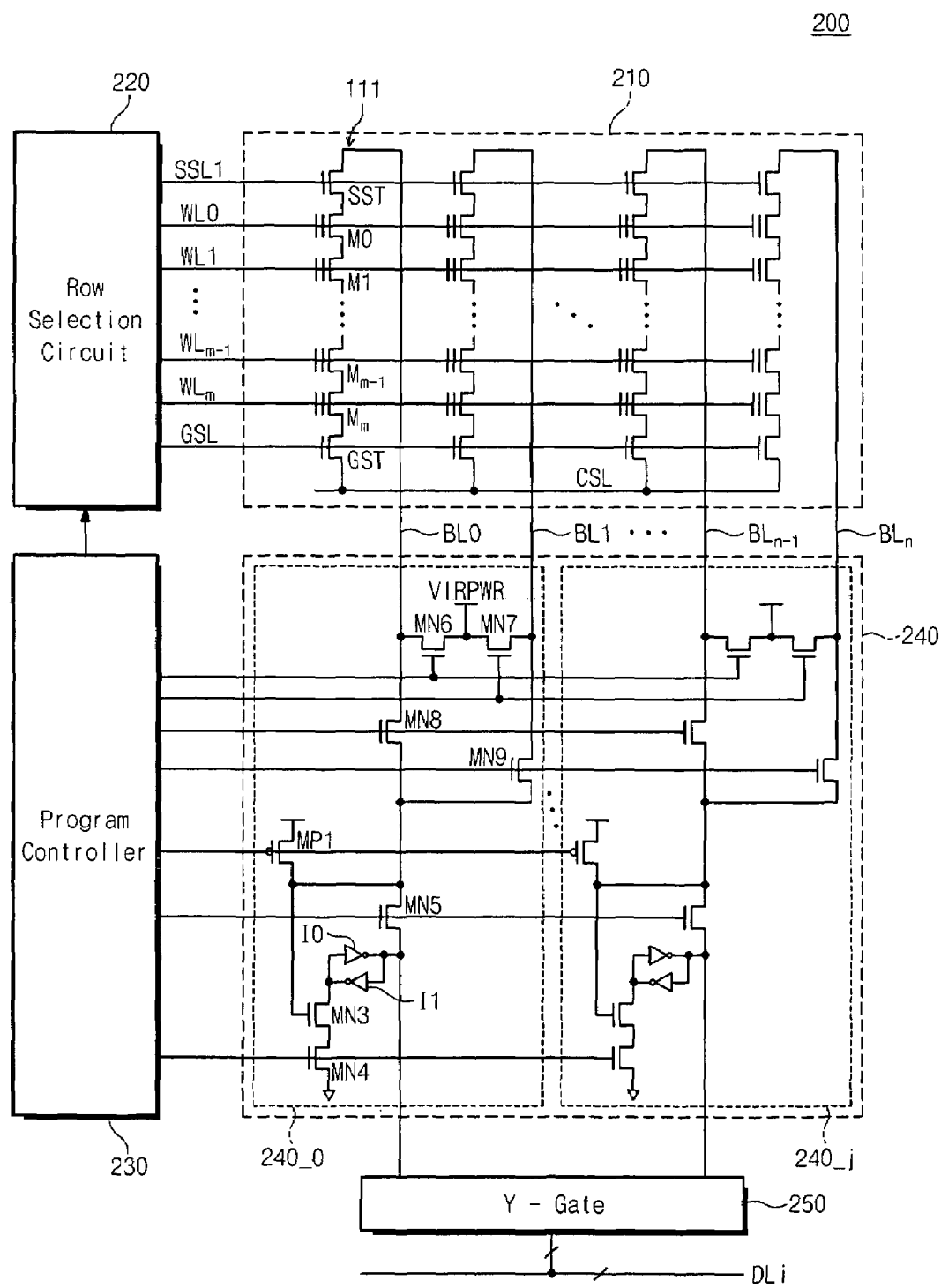
FIG. 10 is a schematic diagram illustrating a flash memory device according to other embodiments of the present invention.

FIG. 10 is a schematic diagram illustrating a flash memory device 200 according to further embodiments of the present invention. As shown in the embodiments of FIG. 10, the flash memory device 200 includes a memory cell array 210, a row selection circuit 220, a program controller 230, a sense amplification and latch circuit 240 and a column gate (Y-gate) circuit 250. As further shown for the embodiments of FIG. 10, the memory cell array 210, the row selection circuit 220 and the column gate circuit 250 correspond substantially to the similarly numbered (e.g., 110, 210) elements of FIG. 4 and such corresponding elements need not be further described herein.

The sense amplification and latch circuit 240 in the illustrated embodiments includes a plurality of sense amplification and latch units 240_0–240_j, each which is connected to a pair of bit lines. For example, sense amplification and latch unit 240_0 is connected to bit lines BL0 and BL1 and sense amplification and latch unit 240_j is connected to bit lines BLn-1 and BLn. Each of the sense amplification and latch units may select one of its corresponding pair of bit lines. Each of the sense amplification and latch units may read data from the flash EEPROM cells through a selected bit line in a read operation. In addition, in a program operation, each of the sense amplification and latch units may provide a ground/power voltage to the selected bit line based on associated program data.

Embodiments of programming methods for the flash memory device 200 will now be more fully described with reference to FIG. 10. As well known, the flash EEPROM cells may be erased to have a −3V or like threshold voltage before programming. Data that will be stored in the memory cell array 210 may be loaded through the column gate circuit 250 to the sense amplification and latch circuit 240 by word/byte unit. After data to be programmed is loaded to the sense amplification and latch circuit 240, voltages of the word lines WL0–WLm and the bit lines BL0–BLn may be set by the program controller 230.

The program controller 230 may control the sense amplification and latch circuit 140 so that the bit lines BL0–BLn are precharged to the power voltage. This may be done by turning on the NMOS transistors MN6 and MN7 of each of the sense amplification and latch unit during a predetermined time. While the bit lines BL0–BLn are precharged to the power voltage, the string selection line SSL, the word lines WL0–WLm and the ground voltage of the ground selection line GSL are maintained at a low level. As the string selection line SSL is at the ground voltage, each of the cell strings is electrically disconnected from a corresponding bit line. After precharging the bit lines to the power voltage, the program controller 230 may turn off the NMOS transistor MN6 of each of the sense amplification and latch units 240_0 to 240_j. The NMOS transistor MN7 of the sense amplification and latch units 240_0 to 240_j may be continuously connected to a VIRPWR terminal at the power voltage.

The power voltage is then provided to the string selection line SSL and a voltage Vcc-Vth (Vth representing a threshold voltage of the string selection transistor) is precharged to the channel region of each string. The string selection transistors SST of the cell strings 111 may then be turned off to float the channel regions of the cell strings 111. With the string selection transistors SST turned off, the pass voltage Vpass may be provided to the selected and non-selected word lines WL0–WLm. After providing the pass voltage Vpass to the selected and non-selected word lines WL0–WLm at the same time, a voltage of the selected word line is increased from the pass voltage Vpass to the programming voltage Vpgm. As the channel regions of the cell strings 111 are in a floating state, the channel regions of the cell strings 111 are boosted when Vpgm is applied. Accordingly, the flash EEPROM cells of the selected word line are not programmed as the applied bias condition is not sufficient to cause F-N tunneling between the control gate of the flash EEPROM cell and the channel region.

While in the bias state described above, after the programming voltage Vpgm is applied to the selected word line and a predetermined time has passed, the program controller 230 controls the sense amplification and latch circuit 240 so that the ground voltage (as the program voltage for a cell to be programmed) and the power voltage (as the program inhibit voltage for a cell not to be programmed) are provided to each bit line based on corresponding loaded data. This may be performed by turning on the NMOS transistors MN5 and MN8 of each of the sense amplification and latch units 240_0 to 240_j. A string selection transistor connected to a ground voltage bit line may then be turned on so that a boosted voltage of a channel region of its associated string is discharged through the bit line to a corresponding sense amplification and latch unit. In other words, the ground voltage is provided to the channel region of the cell string. As the ground voltage is provided to the channel region of the cell string, the flash EEPROM cell(s) of the selected word line may become(s) programmed by F-N tunneling.

It will be clearly understood by those skilled in the art that the flash memory device 200 may provide substantially the same characteristics as those discussed for the flash memory device 100. In other words, after control gate voltages of the flash EEPROM cells of the selected word line arrive at the programming voltage Vpgm, regardless of their separation from the row selection circuit, the ground voltage is provided to the channel region of the cell string (or the bit line in a turn-on state of the string selection transistor). Accordingly, in comparison with a conventional programming method, it may be possible to lessen a difference in threshold voltage among the flash EEPROM cells of the same word line, which difference could otherwise be caused by a difference in their separation from the row selection circuit. As a result, decreased programming time and a reduction of deterioration of a read-retention characteristic may be provided.

It will be understood that the flash memory device 200 may be operated as generally described previously with reference to FIG. 6 with the programming voltage Vpgm and the pass voltage Vpass being applied to the selected word line and non-selected word line simultaneously.

Figure 11:
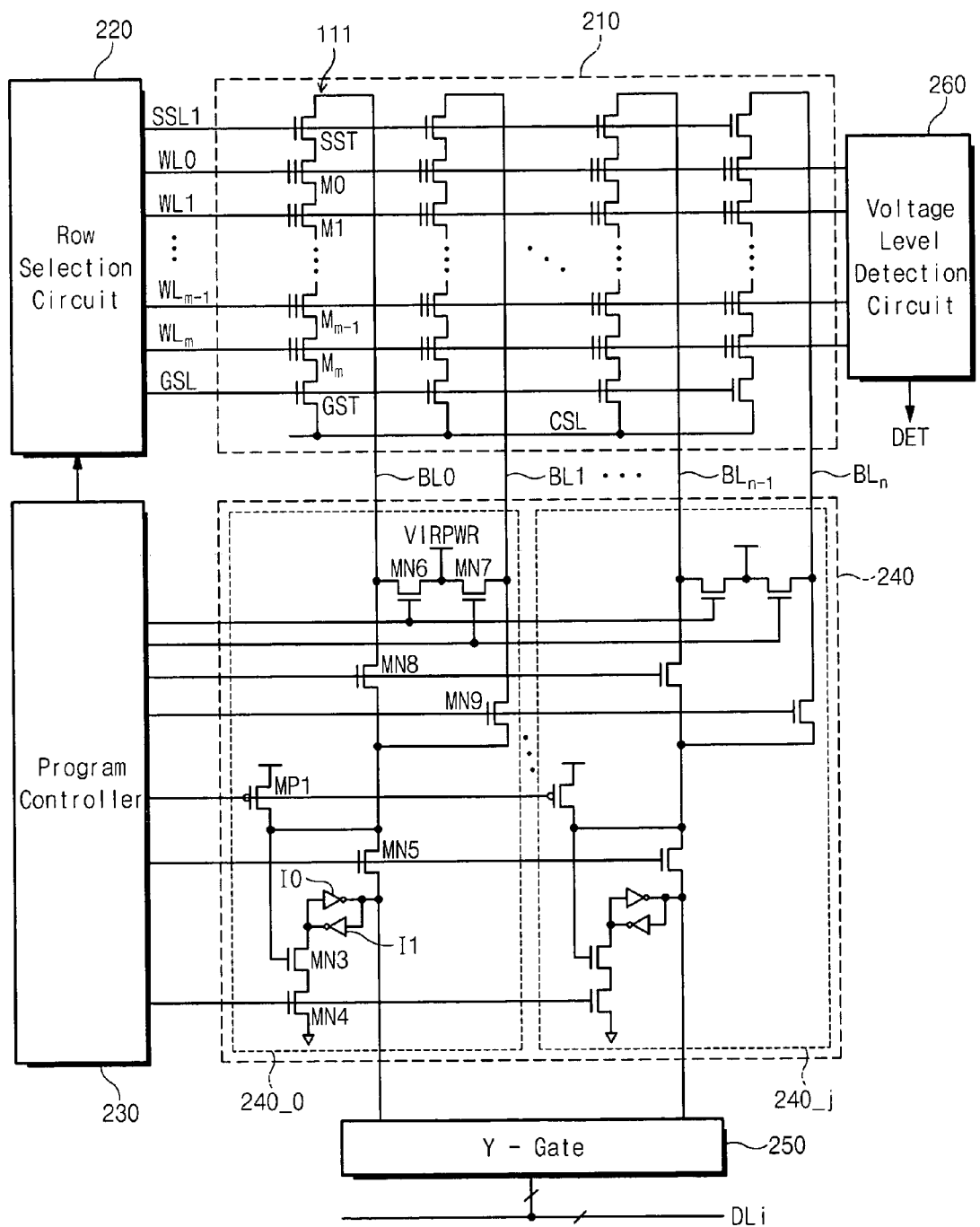
FIG. 11 is a schematic diagram illustrating a flash memory device according to yet further embodiments of the present invention.

FIG. 11 is a schematic diagram illustrating a flash memory device 200 according to further embodiments of the present invention. The flash memory device 200 illustrated in FIG. 11 differs from that illustrated in FIG. 10 in the addition of a voltage level detection circuit 260. The voltage level detection circuit 260 is shown located opposite the row selection circuit 220 and connected to the word lines WL0–WLm. The voltage level detection circuit 260 detects whether a voltage of the selected word line reaches the programming voltage Vpgm. If a voltage of the selected word line reaches the programming voltage Vpgm, the voltage level detection circuit 260 activates the detection signal DET. The program controller 230 controls the sense amplification and latch circuit 240 or the row selection circuit 220 responsive to an activation of the detection signal DET so that the ground voltage is provided to the channel region of the string. For example, when the programming method illustrated in FIG. 6 is used for the flash memory device 200 of FIG. 11, the program controller 230 may control the sense amplification and latch circuit 240 responsive to activation of the detection signal DET so that the NMOS transistors MN5 and MN8 of each of the sense amplification and latch circuit are turned on. When the programming method illustrated in FIG. 7 is used for the flash memory device 200 of FIG. 11, the program controller 230 may control the row selection circuit 220 responsive to the detection signal DET so that the string selection transistors SST are turned on. The flash memory device 200 of FIG. 11 may otherwise operate as described previously and, therefore, need not be further described herein.

Note that, if the program voltage Vpgm is provided to the selected word line and then controls the string selection transistor, a metal line may be formed on the string selection line to reduce a resistance of the string selection line.

As previously mentioned, after control gate voltages of the flash EEPROM cells of the selected word line reach the programming voltage Vpgm, regardless of their separation from the row selection circuit, the ground voltage may be provided to the channel region of the cell string (or the bit line in a turn-on state of the string selection transistor) to be programmed. As a result, it may be possible to lessen a difference in threshold voltage among the flash EEPROM cells of the same word line, which difference could otherwise be caused by a difference in the cells separation from the row selection circuit. As a result, a decreased programming time and a reduction of deterioration of a read-retention characteristic of the memory device may be provided.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method for programming a flash memory device having a memory cell string including a plurality of memory cells, the method comprising, during a programming cycle, delaying application of a program voltage to a channel region of the plurality of memory cells until after a gate of each of the memory cells of the plurality of memory cells that is to be programmed has reached a programming voltage Vpgm, wherein the string further includes a string selection transistor and wherein the program voltage is a ground voltage and wherein delaying application of a program voltage comprises:
   charging the channel region of the plurality of memory cells to a program-inhibit voltage;
   floating the charged channel region of the plurality of memory cells;
   applying a voltage to the gates of each of the memory cells to be programmed while the charged channel region is floating; and then
   connecting the channel region of the plurality of memory cells to the program voltage after the gate of each of the memory cells to be programmed has reached the programming voltage Vpgm.

2. The method of claim 1 wherein charging the channel region comprises:
   connecting a bit line coupled to the string selection transistor to the program-inhibit voltage;
   disconnecting the bit line from the program-inhibit voltage after charging of the bit line; and then
   activating the string selection transistor to couple the charged bit line to the channel region.

3. The method of claim 2 wherein connecting the channel region of the plurality of memory cells to the program voltage comprises connecting the bit line to a latched voltage of a sense amplifier.

4. The method of claim 1 wherein applying a voltage to the gates of each of the memory cells to be programmed while the charged channel region is floating comprises:
   applying a pass voltage Vpass to the gates of each of the memory cells; and then
   applying the programming voltage Vpgm to the gates of each of the memory cells to be programmed.

5. The method of claim 1 further comprising applying a pass voltage Vpass to gates of the memory cells that are not to be programmed while the charged channel region is floating.

6. The method of claim 1 wherein the memory cell string further includes a string selection transistor and wherein the program voltage is a ground voltage and wherein delaying application of a program voltage comprises:
   deactivating the string selection transistor;
   applying the program voltage to a bit line connected to the deactivated string selection transistor;
   applying the programming voltage Vpgm to the gates of each of the memory cells to be programmed; and then
   activating the string selection transistor to apply the program voltage to the channel region of the plurality of memory cells;
   wherein applying the programming voltage Vpgm to the gates of each of the memory cells to be programmed comprises;
   applying a pass voltage Vpass to the gates of each of the memory cells; and then
   applying the programming voltage Vpgm to the gates of each of the memory cells to be programmed.

7. The method of claim 6 further comprising applying a pass voltage Vpass to gates of the memory cells that are not to be programmed before activating the string selection transistor.

8. The method of claim 1 wherein the string comprises a string selection transistor, a gate selection transistor and the plurality of memory cells extending serially between the string selection transistor and the gate selection transistor and wherein gates of the plurality of memory cells are connected to corresponding word lines and a corresponding bit line is connected to the memory cells through the gate selection transistor.

9. A method of programming a flash memory device which includes at least one memory cell string including a string selection transistor, a gate selection transistor and a plurality of memory cell transistors extending serially between the string selection transistor and the gate selection transistor and wherein gates of the plurality of memory cell transistors are connected to corresponding word lines and a corresponding bit line is connected to the memory cell transistors through the gate selection transistor, the method comprising:
   providing a programming voltage to a selected one of the word lines while a channel region of the string is floated; and
   providing a program voltage to the channel region of the string after a gate voltage of the memory cell transistor corresponding to the selected one of the word lines reaches the programming voltage, further comprising precharging the channel region of the string to a program-inhibit voltage before applying the programming voltage.

10. The method of claim 9, wherein the program voltage is provided to the channel region of the string while the string selection transistor is activated.

11. The method of claim 9, further comprising setting the bit line to the program voltage before applying the programming voltage.

12. The method of claim 11, wherein providing the program voltage includes activating the string selection transistor after a voltage of the selected one of the word lines reaches the programming voltage.

13. The method of claim 9, wherein providing the programming voltage comprises:
providing a pass voltage to the selected one of the word lines and non-selected word lines; and
providing the programming voltage to the selected one of the word lines.

14. The method of claim 9, wherein providing the programming voltage includes simultaneously providing the programming voltage to the selected one of the word lines and a pass voltage to the non-selected word lines.

15. A method of programming a flash memory device which includes at least one memory cell string including a string selection transistor, a gate selection transistor and a plurality of memory cell transistors extending serially between the string selection transistor and the gate selection transistor and wherein gates of the plurality of memory cell transistors are connected to corresponding word lines and a corresponding bit line is connected to the memory cell transistors through the gate selection transistor, the method comprising:
precharging the bit lines to a program-inhibit voltage;
providing a programming voltage to selected word lines and a pass voltage to non-selected word lines while the string selection transistor is activated; and
providing either a program voltage or the program inhibit voltage to each bit line after gate voltages of the memory cell transistors of the selected word lines reaches the programming voltage.

16. The method of claim 15, wherein the the program-inhibit voltage is a power voltage and wherein the program voltage is a ground voltage.

17. The method of claim 15, wherein after a voltage of the selected word lines reaches the programming voltage, the program voltage is provided to a bit line connected to a memory cell transistor to be programmed.

18. The method of claim 15, wherein after a voltage of the selected word lines reaches the programming voltage, the program-inhibit voltage is provided to a bit line connected to a memory cell transistor to be program-inhibited.

19. A method of programming a flash memory device which includes at least one memory cell string including a string selection transistor, a gate selection transistor and a plurality of memory cell transistors extending serially between the string selection transistor and the gate selection transistor and wherein gates of the plurality of memory cell transistors are connected to corresponding word lines and a corresponding bit line is connected to the memory cell transistors through the gate selection transistor, the method comprising:
precharging the bit lines to a program-inhibit voltage;
turning on a string selection transistor of each string;
providing a pass voltage to the word lines; and then
providing a programming voltage to selected ones of the word lines; and
providing either a program voltage or the program-inhibit voltage to each of the bit lines after gate voltages of the memory cell transistors of the selected word lines reach the programming voltage.

20. A flash memory device comprising:
a memory cell string including a plurality of memory cell transistors; and
a controller configured to, during a programming cycle, delay application of a program voltage to a channel region of the plurality of memory cell transistors until after a gate of each of the memory cell transistors of the plurality of memory cells that is to be programmed has reached a programming voltage Vpgm, wherein the string further includes a string selection transistor coupling the channel region to a bit line and wherein the flash memory device further comprises:
a sense amplifier latch circuit coupled to the bit line and configured to latch data to be programmed into the memory cell transistors;
a program transistor connecting the bit line to the program-inhibit voltage; and
a data transistor connecting the bit line to the latched data; and
wherein the controller is configured to, activate the program transistor to precharge the bit line to a program-inhibit voltage and to active the data transistor to provide the latched data to the bit line.

21. The flash memory device of claim 20 further comprising a voltage level detection circuit coupled to the gates that detects a voltage at the gates and generates a detection signal responsive to detection of the programming voltage at the gate of each of the memory cell transistors of the plurality of memory cells that is to be programmed and wherein the controller is configured to apply the program voltage responsive to the detection signal.

22. A flash memory device comprising:
a string having a string selection transistor, a ground selection transistor and memory cell transistors serially connected between the string selection and the ground selection transistors;
a bit line connected to the string;
a string selection line connected to the string selection transistor;
word lines connected to the memory cell transistors;
a row selection circuit configured to select at least one of the word lines;
a sense amplification and latch circuit connected to the bit line, wherein the sense amplification and latch circuit includes a latch defined by a pair of inverters;
a column gate circuit coupled to the sense amplification and latch circuit that is configured to transfer data from the sense amplification and latch circuit; and
a control circuit configured to control the sense amplification and latch circuit and the row selection circuit, wherein the control circuit controls the row selection circuit and the sense amplification and latch circuit so that a channel region of the string is set to a program voltage during a program cycle after at least one of the word lines selected by the row selection circuit is driven to a programming voltage by the row selection circuit.

23. The flash memory device of claim 22, wherein the control circuit controls the sense amplification and latch circuit so that the bit line becomes precharged to a power voltage before the programming voltage is provided to the at least one selected word line.

24. The flash memory device of claim 23, wherein the control circuit is configured to active the string selection transistor before the bit line is precharged to the power voltage and the programming voltage is provided to the at least one selected word line.

25. The flash memory device of claim 22, wherein the control circuit controls the row selection circuit so as to provide the programming voltage to only selected word line after a pass voltage is first provided to the word lines.

26. The flash memory device of claim 22, wherein the control circuit controls the row selection circuit so as to simultaneously provide the programming voltage to the at least one selected word line and a pass voltage to other of the word lines.

27. The flash memory device of claim 22, wherein the control circuit controls the sense amplification and latch circuit to set the bit line to the program voltage or a program-inhibit voltage responsive to data to be programmed while maintaining the string selection transistor deactivated until the at least one selected word lines reaches the programming voltage at each of the associated memory cells for selected word lines.

28. The flash memory device of claim 22, wherein the control circuit controls the row selection circuit to activate the string selection circuit after the bit line reaches the program voltage or the program-inhibit voltage responsive to data to be programmed.

29. The flash memory device of claim 22, wherein the program voltage is a ground voltage.

30. The flash memory device of claim 22, further comprising a metal line formed on the string selection line that reduces resistance of the string selection line, wherein the string selection line is electrically connected through a contact to the metal line.

31. A flash memory device comprising:
   a string having a string selection transistor, a ground selection transistor and memory cell transistors serially connected between the string selection and ground selection transistors;
   a bit line connected to the string;
   a string selection line connected to the string selection transistor;
   word lines connected to the memory cell transistors;
   a row selection circuit configured to select at least one of the word lines;
   a sense amplification and latch circuit connected to the bit line;
   a voltage detection circuit connected to the word lines with the memory cells between the voltage detection circuit and the row selection circuit; and
   a control circuit configured to control the sense amplification and latch circuit and the row selection circuit, wherein the control circuit controls the row selection circuit and the sense amplification and latch circuit so that a channel region of the string is set to a program voltage during a program operation when an output of the voltage detection circuit indicates that a voltage level of the at least one selected word line reaches the programming voltage.

32. The flash memory device of claim 31, wherein the control circuit is configured to control the sense amplification and latch circuit to precharge the bit line to a power voltage before the programming voltage is provided to the at least one selected word line.

33. The flash memory device of claim 32, wherein the control circuit is configured to activate the string selection transistor before the bit line is precharged to a power voltage and the programming voltage is provided to the at least one selected word line.

34. The flash memory device of claim 31, wherein the control circuit is configured to control the row selection circuit to simultaneously provide the programming voltage to the at least one selected word line and a pass voltage to other word lines.

35. The flash memory device of claim 31, wherein the control circuit is configured to control the row selection circuit to provide a pass voltage to the words lines and then provide the programming voltage to only the at least one selected word line.

* * * * *